(12) United States Patent
Moheimani et al.

(10) Patent No.: US 11,852,654 B2
(45) Date of Patent: Dec. 26, 2023

(54) CANTILEVER WITH A COLLOCATED PIEZOELECTRIC ACTUATOR-SENSOR PAIR

(71) Applicant: Board of Regents, The University of Texas System, Austin, TX (US)

(72) Inventors: Seyed Omid Reza Moheimani, Allen, TX (US); Mohammad Mahdavi, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 483 days.

(21) Appl. No.: 16/932,161

(22) Filed: Jul. 17, 2020

(65) Prior Publication Data

US 2021/0020825 A1  Jan. 21, 2021

Related U.S. Application Data

(60) Provisional application No. 62/876,438, filed on Jul. 19, 2019.

(51) Int. Cl.
   *G01Q 10/04* (2010.01)
   *G01Q 20/04* (2010.01)
   (Continued)

(52) U.S. Cl.
   CPC ........... *G01Q 10/045* (2013.01); *G01Q 20/04* (2013.01); *G01Q 60/38* (2013.01);
   (Continued)

(58) Field of Classification Search
   CPC .... H01L 41/0825; G01Q 60/38; G01Q 20/04; G01Q 10/045
   See application file for complete search history.

(56) References Cited

U.S. PATENT DOCUMENTS

| 5,537,863 A | * | 7/1996 | Fujiu | ..................... | H01L 41/094 73/866.5 |
| 5,633,455 A | * | 5/1997 | Quate | .................... | G01Q 20/04 977/854 |

OTHER PUBLICATIONS

Dubois et al. 'Properties of aluminum nitride thin films for piezoelectric transducers and microwave filter applications', May 17, 1999, App. Phys. Lett., V 74, No. 20, pp. 3032-3034 (Year: 1999).*

(Continued)

*Primary Examiner* — Eliza W Osenbaugh-Stewart
(74) *Attorney, Agent, or Firm* — Yee & Associates, P.C.

(57) ABSTRACT

Illustrative embodiments provide an apparatus comprising a substrate comprising a cantilever, a bottom electrode on the substrate, a bottom piezoelectric transducer on the bottom electrode such that the bottom electrode is between the substrate and the bottom piezoelectric transducer, a middle electrode on the bottom piezoelectric transducer such that the bottom piezoelectric transducer is between the bottom electrode and the middle electrode, a top piezoelectric transducer on the middle electrode such that the middle electrode is between the bottom piezoelectric transducer and the top piezoelectric transducer, and a top electrode on the top piezoelectric transducer, such that the top piezoelectric transducer is between the middle electrode and the top electrode. Illustrative embodiments also provide a method of making the apparatus and a method of using the apparatus for atomic force microscopy.

14 Claims, 9 Drawing Sheets

(51) Int. Cl.
*G01Q 60/38* (2010.01)
*H10N 30/30* (2023.01)
*H10N 30/87* (2023.01)
*H10N 30/00* (2023.01)

(52) U.S. Cl.
CPC ....... *H10N 30/1071* (2023.02); *H10N 30/306* (2023.02); *H10N 30/872* (2023.02); *H10N 30/877* (2023.02)

(56) References Cited

OTHER PUBLICATIONS

Quenzer et al. 'Fabrication of conducting AFM Cantilevers with AlN-based piezoelectric actuators' Sep. 4-7, 2011, Procedia Engineering 25, pp. 665-668 (Year: 2011).*

Ruppert et al. 'Multimodal atomic force microscopy with optimized higher eigenmode sensitivity using on-chip piezoelectric actuation and sensing' Jan. 2, 2019, Nanotechnology, V30, N8 (Year: 2019).*

* cited by examiner

CANTILEVER WITH A COLLOCATED PIEZOELECTRIC ACTUATOR-SENSOR PAIR

CROSS-REFERENCE TO RELATED APPLICATION

This application claims priority to U.S. Provisional Application 62/876,438, filed Jul. 19, 2019, the entirety of which is hereby incorporated by reference.

STATEMENT REGARDING FEDERALLY-SPONSORED RESEARCH OR DEVELOPMENT

This invention was made with government support under Grant No. DE-EE0008322 awarded by the Department of Energy. The government has certain rights in the invention.

BACKGROUND INFORMATION

1. Field

The present disclosure relates generally to piezoelectric actuators and sensors and to the use of piezoelectric actuators and sensors in a cantilever assembly for atomic force microscopy and other appropriate applications. The present disclosure further relates to methods for fabricating piezoelectric actuators and sensors for a cantilever assembly using microelectromechanical fabrication techniques.

2. Background

Amplitude-modulated atomic force microscopy, AFM, is widely used for capturing surface topographies and analyzing material properties at the nanoscale. Amplitude-modulated atomic force microscopy is also known as the tapping-mode AFM. Amplitude-modulated atomic force microscopy relies on changes in the vibration amplitude of a microcantilever probe as the probe is being scanned over a surface of interest. The microcantilever probe is driven to vibrate at its first flexural resonance mode and brought in close proximity to the surface. While the vibrating cantilever scans over the surface, a sharp tip located at the free end of the cantilever makes intermittent contact with the surface. Interfacial forces between the tip and the sample modulate the vibration amplitude of the cantilever. A deflection sensor translates vibrations of the cantilever to an electrical signal, which is fed to an amplitude demodulator that extracts the envelope of the high-frequency signal. A proportional-integral, PI, controller drives a z-actuator that adjusts the vertical position of the cantilever relative to the sample surface in order to keep the vibration amplitude constant. The controlled vertical position of the cantilever as it is moved across the surface may be plotted to create an image of the surface topography.

Optical beam deflection, OBD, is a known technique that is widely used in commercial atomic force microscopes to measure the vibration amplitude of the cantilever probe as it is scanned over the surface of a sample. In optical beam deflection, a focused laser beam is reflected from the free end of the cantilever and captured by a position sensitive photodetector, PSPD. The position sensitive photodetector maps the deflections of the cantilever to a signal. Optical beam deflection is an approach to cantilever deflection measurement that enables an atomic force microscope to achieve atomic resolution. However, since the optical beam deflection sensor is not integrated with the cantilever, it requires frequent adjustments. Furthermore, using a single optical sensor to measure deflection of an array of cantilevers is relatively complicated.

A microcantilever with embedded actuation and sensing capabilities thus may be desirable. There have been attempts to use microelectromechanical systems, MEMS, processes in order to realize cantilevers with integrated sensors and actuators for atomic force microscopy. For example, bimorph actuation based on piezoelectric and electrothermal transduction methods have been employed to actuate silicon cantilevers. The electrical charge induced in piezoelectric transducers has been used to measure the vibration of piezoelectric cantilevers. In electrothermally actuated cantilevers, measurements of a piezoresistor obtained from a Wheatstone bridge have been used for sensing.

Atomic force microscopy imaging with commercially available piezoelectric microcantilevers has been previously demonstrated. These cantilevers contain a layer of ZnO piezoelectric material sandwiched between two metal layers serving as electrodes. An actuation voltage is applied to the top electrode to oscillate the cantilever at its resonance frequency. The electrical charge resulting from the piezoelectric effect is measured using a readout circuit. For an ideal cantilever with a quality factor of $Q \gg 1$, the vibration amplitude at resonance is approximately Q times larger than when it is operating off resonance. If the piezoelectric sensor follows the cantilever dynamics well, one should be able to make the same observation with the piezoelectric charge. In practice, however, the piezoelectrically induced charge is significantly less than the electrically induced charge due to dielectric properties of the piezoelectric layer. This is known as the "feedthrough effect", since the charge is induced through an unintended electrical path from input to the output.

In order to recover the dynamic response of the cantilever from the measured charge, several cancellation methods have been proposed. One approach is based on electronically mimicking the feedthrough path using a capacitance with the same value as the feedthrough capacitance of the piezoelectric layer, and subtracting its charge from the output charge of the cantilever. The dynamic range resulting from this approach may be satisfactory for many tapping mode atomic force microscopy applications. However, this method is relatively complicated and extending this method to more than one mode may be difficult.

Therefore, there may be a need for an apparatus and method that take into account at least some of the issues discussed above, as well as other possible issues.

SUMMARY

The illustrative embodiments provide an apparatus comprising a substrate comprising a cantilever, a bottom electrode on the substrate, a bottom piezoelectric transducer on the bottom electrode such that the bottom electrode is between the substrate and the bottom piezoelectric transducer, a middle electrode on the bottom piezoelectric transducer such that the bottom piezoelectric transducer is between the bottom electrode and the middle electrode, a top piezoelectric transducer on the middle electrode such that the middle electrode is between the bottom piezoelectric transducer and the top piezoelectric transducer, and a top electrode on the top piezoelectric transducer, such that the top piezoelectric transducer is between the middle electrode and the top electrode.

Illustrative embodiments also provide a method of making a cantilever assembly. A cantilever is formed on a substrate. A bottom electrode is formed on the cantilever. A bottom piezoelectric transducer is formed on the bottom electrode such that the bottom electrode is between the substrate and the bottom piezoelectric transducer. A middle electrode is formed on the bottom piezoelectric transducer such that the bottom piezoelectric transducer is between the bottom electrode and the middle electrode. A top piezoelectric transducer is formed on the middle electrode such that the middle electrode is between the bottom piezoelectric transducer and the top piezoelectric transducer. A top electrode is formed on the top piezoelectric transducer such that the top piezoelectric transducer is between the middle electrode and the top electrode.

Illustrative embodiments also provide a method of atomic force microscopy comprising: providing an actuation signal to a top electrode to cause a cantilever to vibrate, wherein the cantilever comprises: a substrate, a bottom electrode on the substrate, a bottom piezoelectric transducer on the bottom electrode such that the bottom electrode is between the substrate and the bottom piezoelectric transducer, a middle electrode on the bottom piezoelectric transducer such that the bottom piezoelectric transducer is between the bottom electrode and the middle electrode, a top piezoelectric transducer on the middle electrode such that the middle electrode is between the bottom piezoelectric transducer and the top piezoelectric transducer, and the top electrode on the top piezoelectric transducer such that the top piezoelectric transducer is between the middle electrode and the top electrode, wherein the substrate and the middle electrode are connected to ground; and detecting an electrical signal on the bottom electrode that is relative to a vibration amplitude of the cantilever while the actuation signal is provided to the top electrode and the cantilever is moved over a surface.

Other variations are possible, as described below.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account a variety of considerations. For example, the illustrative embodiments recognize and take into account that an alternative approach to determining the dynamic response of a cantilever from a measured charge is to increase the electrical isolation between input and output electrodes by physically separating the piezoelectric actuator from the sensor. This allows for three possibilities. In a three-port configuration, bottom electrodes of both transducers are grounded. An actuation voltage is applied to the top electrode of one transducer and the charge is measured at the top electrode of the other transducer. Alternatively, if three piezoelectric transducers are available, differential sensing may be performed. For example, an actuation voltage may be applied to the middle transducer with a grounded bottom electrode. The remaining two transducers are grounded at opposite electrodes to enable charge sensing with 180° phase shift, and thus differential sensing. Combining the two signals removes the feedthroughs corresponding to the two sense paths. Finally, in a pseudo actuation configuration, a parallel path with a tunable gain is established through a separate dielectric layer to reduce the electrical feedthrough of the piezoelectric path.

Figure 1:
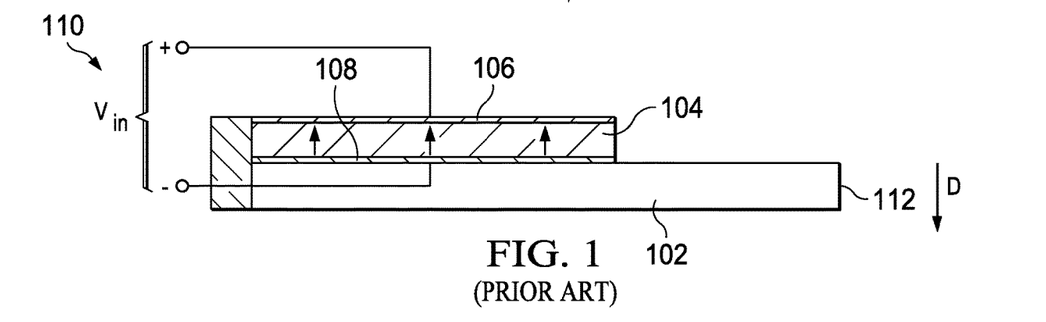
FIG. 1 is a schematic section view illustration of a known piezoelectric cantilever assembly with a single piezoelectric transducer in accordance with the prior art.

Turning to FIG. 1, a schematic section view illustration of a known piezoelectric cantilever with a single piezoelectric transducer is depicted in accordance with the prior art. Illustrative embodiments recognize and take into account that a known microelectromechanical piezoelectric active cantilever 100 may include thin silicon layer 102 on which piezoelectric transducer 104 is fabricated between top electrode 106 and bottom electrode 108. Application of voltage $V_{in}$ 110 to piezoelectric transducer 104 via electrodes 106 and 108 mechanically strains cantilever 100, resulting in out-of-plane deflection D of free end 112 of cantilever 100. The first modal response at free end 112 of cantilever 100 due to the applied voltage $V_{in}$ 110, may be expressed as:

$$D(s) = \frac{\alpha \omega_0^2}{s^2 + \frac{\omega_0}{Q}s + \omega_0^2} V_{in}(s) \quad (1)$$

where $\omega_0$ is the first resonance frequency of cantilever 100, a is an electromechanical coupling factor, and Q is the quality factor of the first mode.

Figure 2:
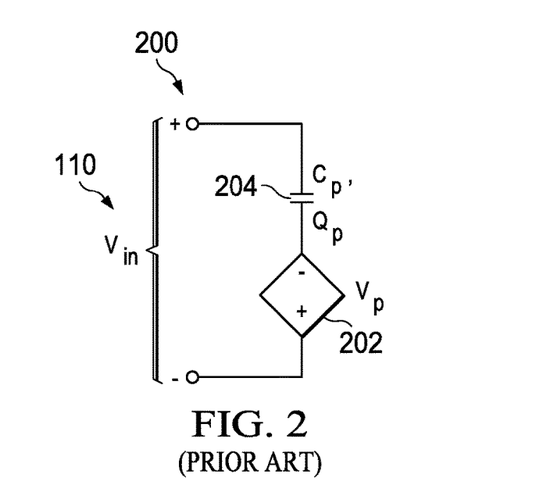
FIG. 2 is a schematic illustration of an electrical model of the known piezoelectric cantilever assembly of FIG. 1.

Turning to FIG. 2 a schematic illustration of an electrical model 200 of known piezoelectric cantilever 100 of FIG. 1 is depicted. When transducer 104 of piezoelectric cantilever 100 is mechanically strained, electrical charges appear on transducer electrodes 106 and 108, due to the piezoelectric effect. This effect can be modeled by strain dependent voltage source $V_p$ 202 in series with capacitance $C_p$ 204. The relationship between electrical charge $Q_p$ between electrodes 106 and 108 and the applied voltage $V_{in}$ 110 may be stated as:

$$Q_p(s) = \frac{\beta \omega_0^2}{s^2 + \frac{\omega_0}{Q}s + \omega_0^2} V_{in}(s) + C_p V_{in}(s) \qquad (2)$$

where β is an electromechanical coupling factor associated with the piezoelectric effect. Based on Equation 2, the total charge between electrodes 106 and 108 is a combination of an electromechanically induced charge due to the piezoelectric effect and an electrically induced charge through the dielectric capacitance of piezoelectric transducer 104. The first term of Equation 2 follows the dynamics of cantilever 100. The second term of Equation 2 is an undesired effect which is often referred to as feedthrough. Illustrative embodiments recognize and take into account that, in a microelectromechanical piezoelectric cantilever, the second feedthrough term is dominant, which conceals the desired cantilever dynamics. To recover the dynamical response of the cantilever measured with the piezoelectric deflection sensor, the feedthrough term must be eliminated or significantly reduced.

Various techniques have been employed to minimize the feedthrough either electronically or at the device level. One approach to reduce the feedthrough is based on physically separating the sensing and actuation functionalities into two separate transducers. If sensor and actuator are both microfabricated from the same piezoelectric layer, a compromise must be made between the space allocated to each transducer and their respective efficiencies. The electromechanical coupling factor of a piezoelectric sensor is a function of its electrode surface area. Therefore, a large sensor size is desirable. However, adequate space must be allocated to the actuator to ensure its efficient functionality.

For example, illustrative embodiments recognize and take into account that known approaches may reduce feedthrough to a reasonable extent. However, known methods may be relative difficult to implement for the typical user of an atomic force microscope. Furthermore, the efficiency of known methods may be limited when applied to high-frequency cantilevers, since they require dividing the cantilever surface between actuation and sense transducers.

In accordance with an illustrative embodiment, sensor and actuator transducers may be stacked on a cantilever. Stacking the two piezoelectric transducers enables a more optimal use of the limited space available on a cantilever surface.

Illustrative embodiments comprise a microfabricated two-layer piezoelectric transducer that provides a collocated actuator-sensor pair with three different terminations at top, middle and bottom electrodes. In accordance with an illustrative embodiment, a two-layer piezoelectric actuator-sensor pair may by microfabricated on a cantilever made of silicon or another appropriate material.

Illustrative embodiments also provide a microfabrication process to realize a collocated actuator-sensor device.

Analysis and finite element simulation show how illustrative embodiments reduce feedthrough capacitance, leading to a significant reduction of the feedthrough effect. A fabricated cantilever in accordance with an illustrative embodiment is characterized and experimental results closely match the simulated behavior of the device.

Illustrative embodiments present a novel approach to fundamentally eliminate the electrical feedthrough crosstalk signal in self-sensing piezoelectric microcantilevers. Illustrative embodiments may be used in dynamic mode atomic force microscopy, AFM, and other appropriate applications. For example, without limitation, illustrative embodiments may provide a silicon microcantilever probe for atomic force microscopy and other appropriate applications.

In accordance with an illustrative embodiment, a two-layer piezoelectric stack transducer is microfabricated on a microcantilever. The top transducer in the stack functions as an actuator while the bottom transducer in the stack is used as a deflection sensor. Illustrative embodiments thus provide a collocated actuator-sensor pair on the same surface area of the microcantilever. Experimental results indicate that the sensor in the actuator-sensor pair is able to capture the full dynamic range of the cantilever with minimal feedthrough from the actuator.

Figure 3:
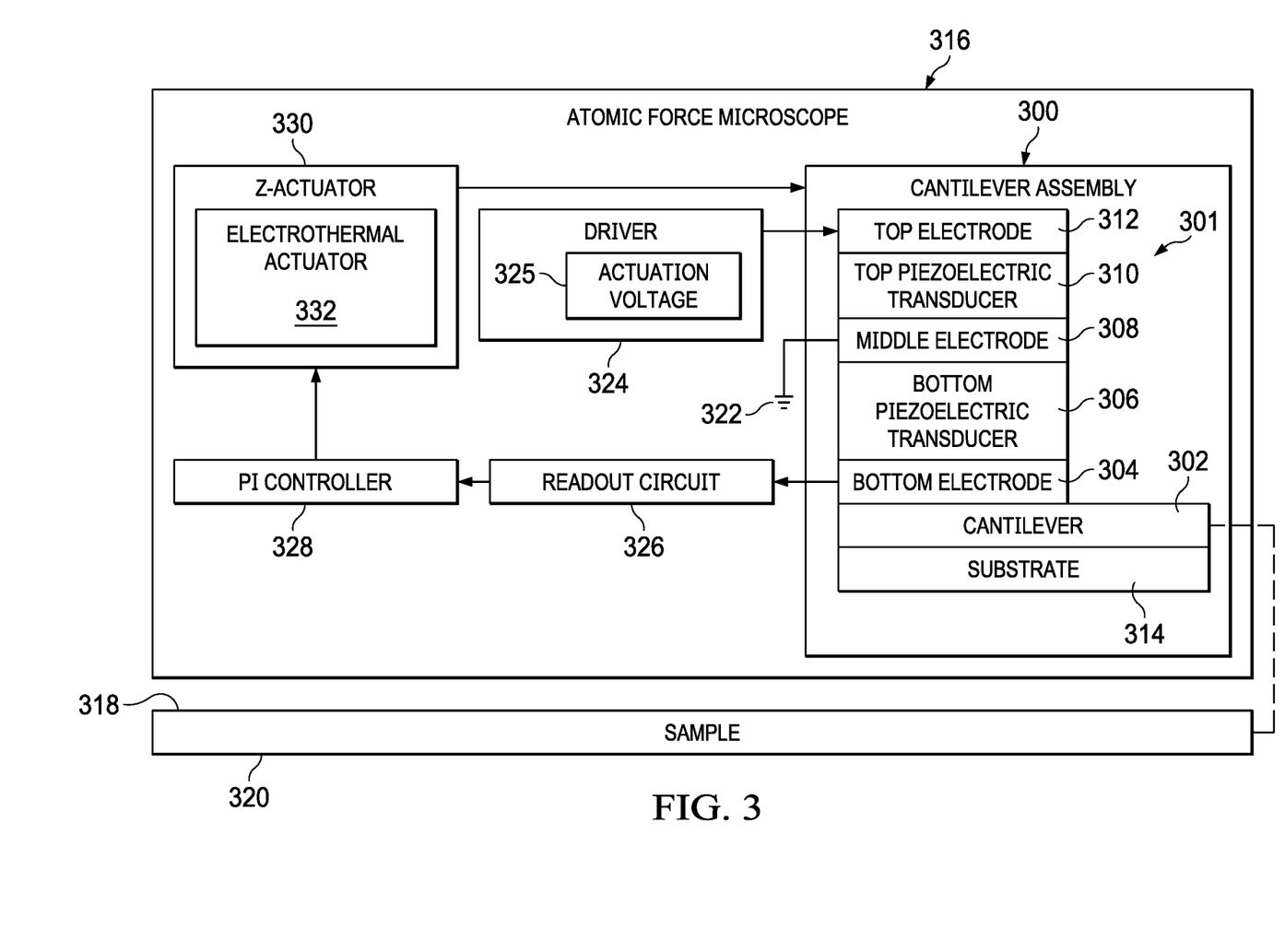
FIG. 3 is a block diagram of a cantilever assembly with a collocated piezoelectric actuator-sensor pair in accordance with an illustrative embodiment.

Turning to FIG. 3, a block diagram of a cantilever assembly with a collocated piezoelectric actuator-sensor pair is depicted in accordance with an illustrative embodiment. In accordance with an illustrative embodiment, cantilever assembly 300 comprises two-layer piezoelectric transducer stack 301 on cantilever 302. Two-layer piezoelectric transducer stack 301 comprises bottom electrode 304, bottom piezoelectric transducer 306, middle electrode 308, top piezoelectric transducer 310, and top electrode 312.

Substrate 314 may be a silicon-on-insulator (SOI) substrate which may comprise a 5 μm thick device layer (DL), a 2 μm thick SiO$_2$ buried oxide (BOX) layer, and 500 μm thick handle layer. The SiO$_2$ layer provides electrical isolation between the bottom electrode 304 and the silicon substrate.

Cantilever 302 may be made from part of SOI substrate 314. For example, without limitation, cantilever 302 may be approximately 350 μm in length and 100 μm in width or have any other appropriate dimensions.

In order to stimulate cantilever 302 into vibrations and measure its deflections, a stack of two piezoelectric transducers 306 and 310 is microfabricated on cantilever 302. For example, without limitation, bottom electrode 304 may be made of approximately 200 nm thick Pt. Bottom piezoelectric transducer 306 may comprise an approximately 1 μm thick AlN piezoelectric layer. Middle electrode 308 may comprise an approximately 200 nm thick Mo layer. Top piezoelectric transducer 310 may comprise an approximately 1 μm thick AlN piezoelectric layer. The various components of cantilever assembly 300 in accordance with an illustrative embodiment may be made of other appropriate materials and may have other appropriate dimensions.

Cantilever assembly 300 may be used in an atomic force microscope 316 to perform tapping mode atomic force microscopy of surface 318 of sample 320. In this case, middle electrode 308 may be connected to ground 322. Top electrode 312 is connected to driver 324 which provides actuation voltage 325. Actuation voltage 325 applied across top piezoelectric transducer 310 produces a stress along the length of cantilever 302, consequently causing cantilever 302 to deflect. Meanwhile, cantilever vibrations produce electrical charges which are accumulated on bottom electrode 304. Bottom electrode 304 is connected to readout circuit 326. Readout circuit 326 is configured to readout the piezoelectric strain signal which serves as a measure of deflection of cantilever 302. In this fashion, the two-layer piezoelectric transducer of cantilever assembly 300 in accordance with an illustrative embodiment enables three-port operation of cantilever 302 to reduce or minimize feedthrough.

Tapping mode AFM relies on changes in vibration amplitude of cantilever 302 operating as a probe while it is being scanned over a surface 318 of sample 320 of interest. Cantilever 302 is driven to vibrate at its first flexural resonance mode by driver 324 and brought in close proximity to surface 318. While the vibrating cantilever 302 scans over surface 318, a sharp tip 340 located at the free end of cantilever 302 (see also FIG. 5) makes intermittent contact with surface 318. Interfacial forces between the cantilever's tip 340 and sample 320 modulate vibration amplitude of cantilever 302. Readout circuit 326 translates vibrations of cantilever 302 to an electronic signal, which is then fed to an amplitude demodulator that extracts an envelope of the high-frequency signal. PI controller 328 drives z-actuator 330 that adjusts the vertical position of cantilever 302 relative to sample 320 in order to keep the vibration amplitude constant. The control effort is then plotted to construct the surface topography.

For example, without limitation, z-actuator 330 may be implemented using a known macroscale piezoelectric z-positioner that is configured to move cantilever 302 in the vertical direction. However, such nano-positioners feature big footprints, require high driving voltages and currents and have limited operation bandwidth, in a range less than a kilo-Hertz. Due to these limitations, such piezo z-actuators are not suitable choices for fast scanning AFM imaging and implementation of AFM array probes.

To overcome the limitations of piezoelectric z-actuators, z-actuator 330 may be implemented using electrothermal actuator 332 embedded within cantilever 302. These types of actuators are referred to as bimorph actuators and may be constructed of a metal layer, e.g. Al, with a higher linear thermal expansion coefficient compared to the Si probe. In essence, electrothermal actuator 332 is a small metal resistor which operates as a heater when a small electrical current, as few as a few tens of mA, is passed through it. In the resistive heater, the electrical power is converted to heat due to Joule's heating. The increase in the temperature causes the metal layer to expand faster than the Si probe to create a bending momentum along electrothermal actuator 332.

To stimulate cantilever 302 into vibration, a sine current may be applied to electrothermal actuator 332. Since the temperature changes in electrothermal actuator 332 are related to electrical power, it has a quadratic relationship with the driving voltage/current. Therefore, a DC electrical power component and an AC electrical power component are created at twice the frequency of the applied current. The DC component produces a static displacement which can be used for vertical movement of cantilever 302 in relation to surface 318 of sample 320 to implement z-actuator 330. The high frequency motion may then be used in tapping mode AFM.

Therefore, electrothermal actuator 332 may drive cantilever 302 for both low frequency and high frequency motions, while the vibration is measured with piezoresistor strain gauges at the anchoring point of cantilever 302 to substrate 314. To measure resistance changes in the piezoresistor, they are driven with DC voltages. This in turn causes temperature instability and self-heating of piezoresistors. In accordance with an illustrative embodiment, however, electrothermal actuator 332 may be used to enable the advantages of low frequency motion of cantilever 302 for vertical movement of the AFM probe against sample 320. However, piezoelectric transducers 310 and 306 are used for both actuation and sensing, respectively, at the resonance frequency of cantilever 302.

The illustration of cantilever assembly 300 in FIG. 3 is not meant to imply physical or architectural limitations to the manner in which illustrative embodiments may be implemented. Other components, in addition to or in place of the ones illustrated, may be used. Some components may be optional. Also, the blocks are presented to illustrate some functional components. One or more of these blocks may be combined, divided, or combined and divided into different blocks when implemented in an illustrative embodiment.

For example, a cantilever assembly in accordance with an illustrative embodiment may be used for applications other than atomic force microscopy. For example, without limitation, a cantilever assembly in accordance with an illustrative embodiment may be used in any appropriate sensing or other application in which it may be desirable to determine accurately a change in the vibration of a vibrating cantilever.

Figure 4:
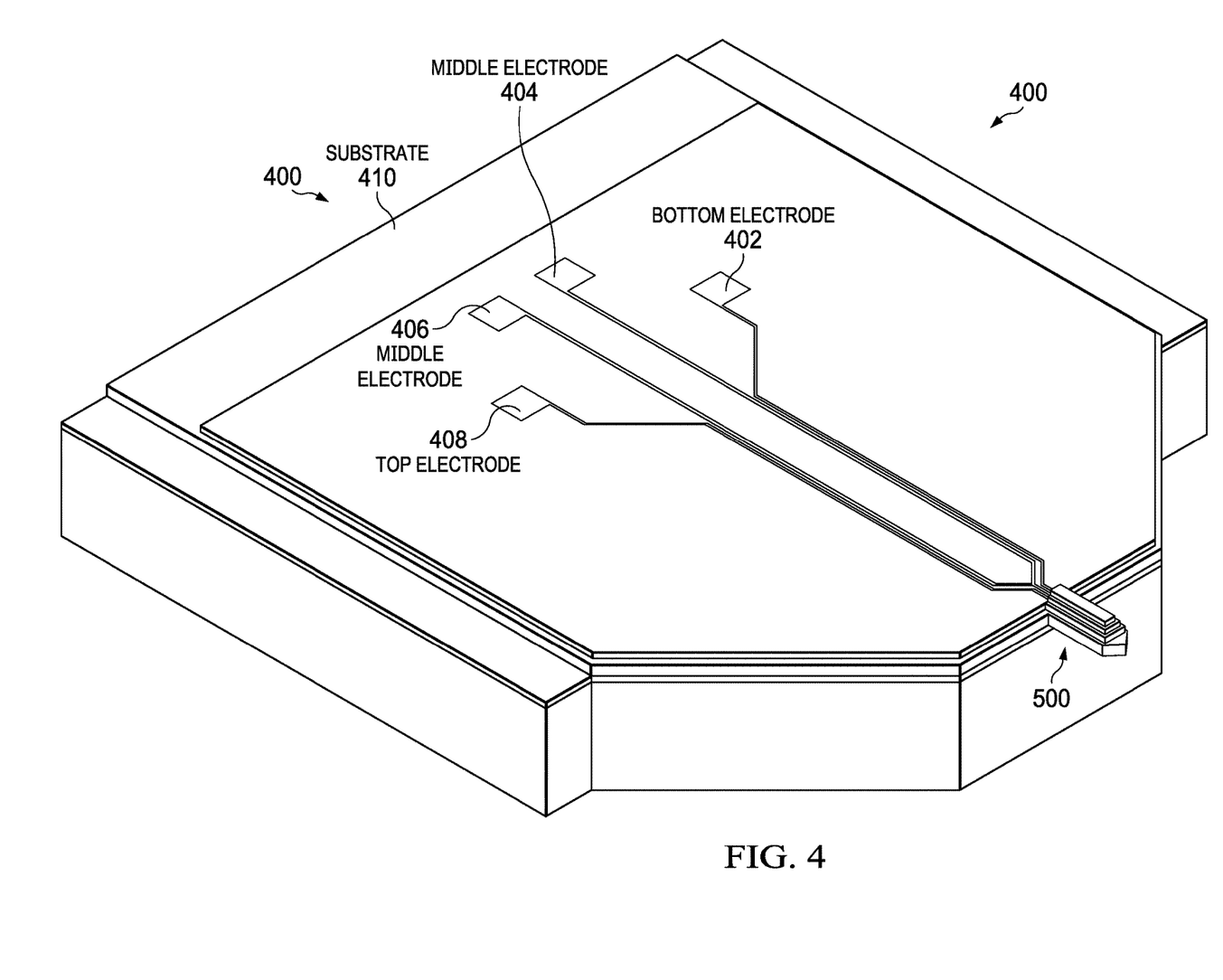
FIG. 4 is a perspective view illustration of a two-layer piezoelectric cantilever assembly showing electrical connections in accordance with an illustrative embodiment.

Turning to FIG. 4, a perspective view illustration of a two-layer piezoelectric cantilever assembly showing electrical connections is depicted in accordance with an illustrative embodiment. FIG. 4 shows the complete structure of one example of a cantilever assembly in accordance with an illustrative embodiment. Cantilever assembly 400 is an example of one implementation of cantilever assembly 300 in FIG. 3.

Aluminum wirebond pads 402, 404, 406, and 408 may provide electrical connections to the three electrodes of the cantilever assembly. Also, a wide pad of aluminum 410 may be designated for an electrical connection to the silicon device layer. Grounding the substrate avoids parasitic and stray capacitances through the substrate.

Figure 5:
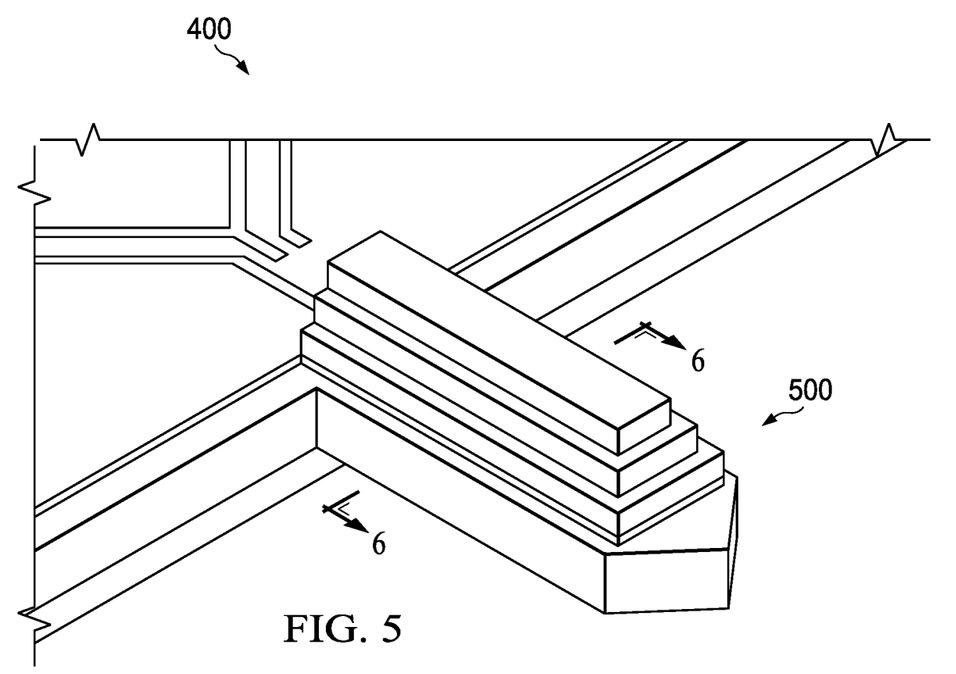
FIG. 5 is an expanded perspective view illustration of a portion the two-layer piezoelectric cantilever assembly in accordance with an illustrative embodiment of FIG. 4.

Turning to FIG. 5, an expanded perspective view illustration of a portion of the two-layer piezoelectric cantilever assembly in accordance with an illustrative embodiment of FIG. 4 is depicted. FIG. 5 presents a close-up view of cantilever 500 portion of cantilever assembly 400.

Figure 6:
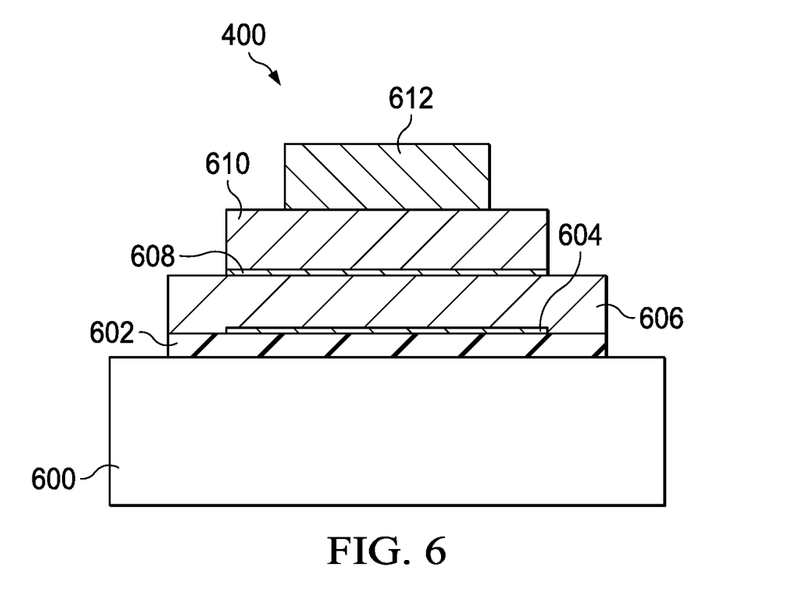
FIG. 6 is a section view illustration of a two-layer piezoelectric cantilever assembly in accordance with an illustrative embodiment taken along line 6-6 of FIG. 5.

Turning to FIG. 6, a section view illustration of the two-layer piezoelectric cantilever assembly in accordance with an illustrative embodiment taken along line 6-6 of FIG. 5 is depicted. FIG. 6 illustrates an example of one possible implementation of the construction of cantilever assembly 500. For example, without limitation, cantilever assembly 500 may comprise Si device layer 600, $SiO_2$ isolation layer 602, Pt bottom electrode 604, bottom AlN piezoelectric layer 606, Mo middle electrode 608, top AlN piezoelectric layer 610, and Al top electrode 612.

Figure 7:
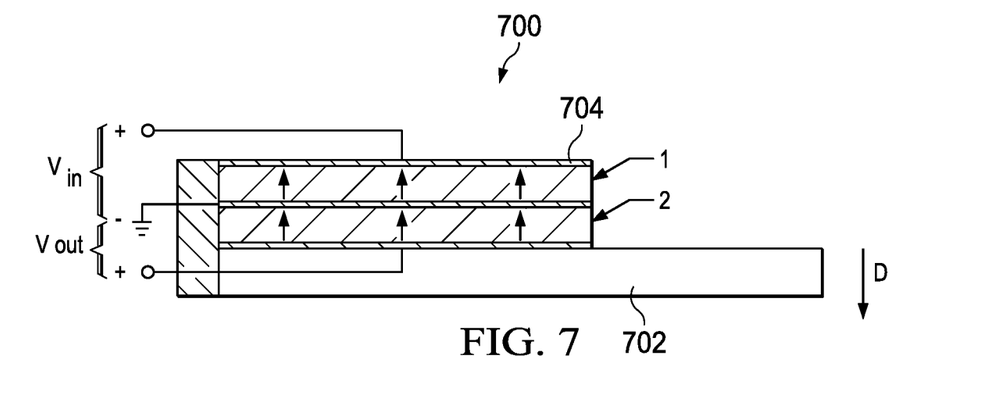
FIG. 7 is a schematic section view illustration of a cantilever assembly with a two-layer piezoelectric transducer in accordance with an illustrative embodiment.

Turning to FIG. 7, a schematic section view illustration of a cantilever assembly with a stacked two-layer piezoelectric actuator-sensor is depicted in accordance with an illustrative embodiment. Cantilever assembly 700 is an example of one implementation of cantilever assembly 300 in FIG. 3. Cantilever assembly 700 includes cantilever 702 on which stacked two-layer piezoelectric actuator-sensor pair 704 is microfabricated.

Figure 8:
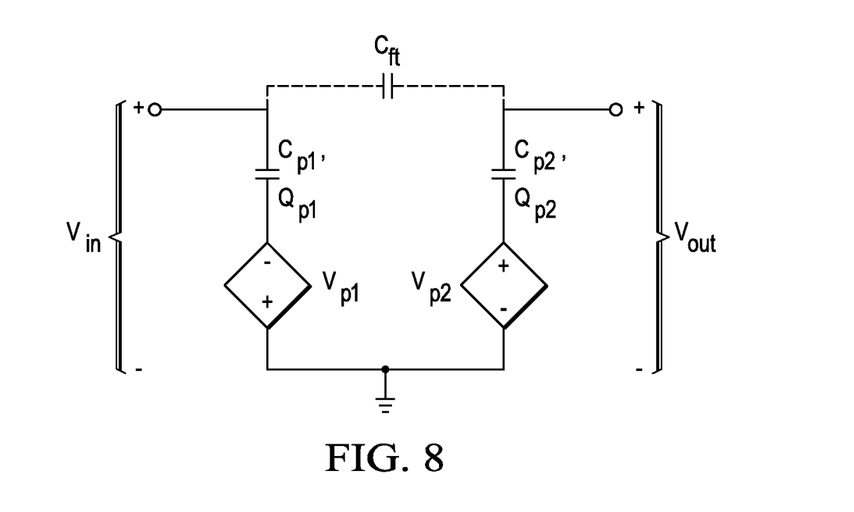
FIG. 8 is a schematic illustration of an electrical model of the two-layer piezoelectric cantilever assembly in accordance with an illustrative embodiment of FIG. 7.

Turning to FIG. 8, a schematic illustration of an electrical model of the two-layer piezoelectric cantilever assembly 700 in accordance with an illustrative embodiment of FIG. 7 is depicted. The two-layer transducer can be modeled by doubling the model of a single transducer cantilever as illustrated in FIG. 2. The path from the input is bypassed to the ground, therefore the dielectric capacitance does not directly contribute to the output charge. Ideally, in this configuration, the feedthrough effect is completely eliminated, and the charge measured on the sense transducer correlates closely with the cantilever dynamics. It has been determined through finite element analysis that a small stray capacitance Cft will result in a feedthrough. However, this capacitance is by far smaller than the dielectric capacitance of the transducer, and can thus be neglected in comparison with the dynamical response of the cantilever.

Figure 9:
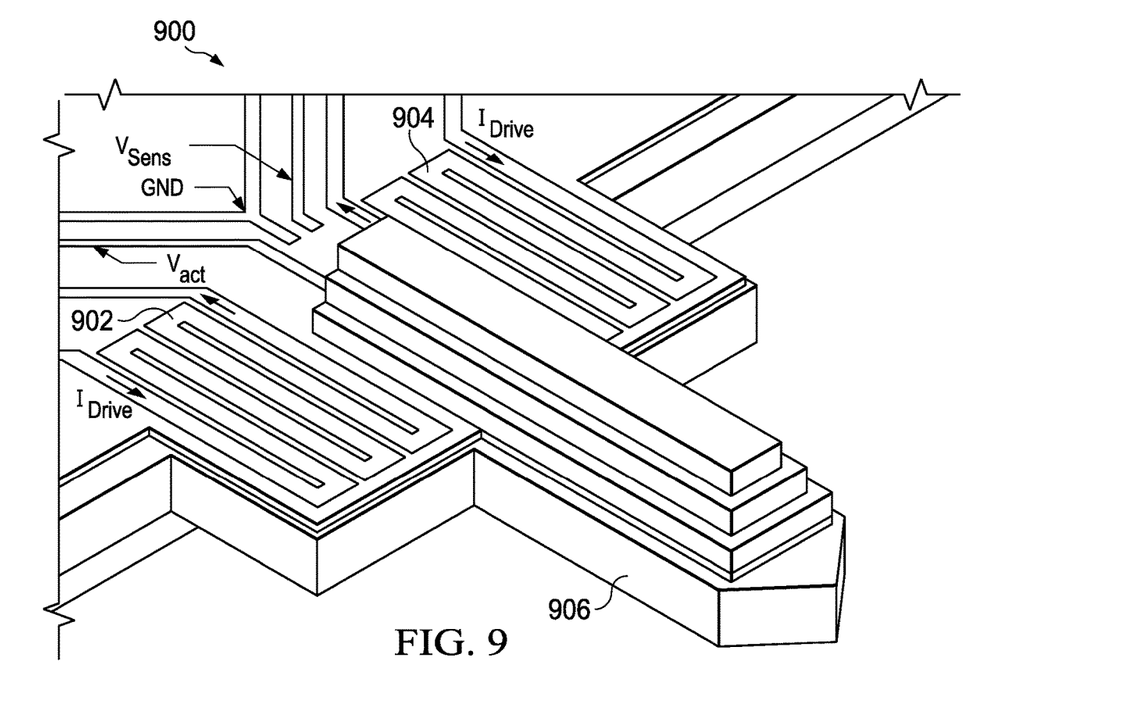
FIG. 9 is a schematic illustration of a cantilever assembly for atomic force microscopy with two electrothermal actuators in accordance with an illustrative embodiment.

Turning to FIG. 9, a schematic illustration of a cantilever assembly for atomic force microscopy with two electrothermal actuators is depicted in accordance with an illustrative embodiment. Cantilever assembly 900 is an example of an implementation of cantilever assembly 300 of FIG. 3 in which z-actuator 330 is implemented as electrothermal actuator 332.

In this example, cantilever assembly 900 comprises two electrothermal actuators 902 and 904 on two sides. Cantilever assembly 900 thus provides an AFM probe comprising a two-layer piezoelectric cantilever in the center in addition to electrothermal actuators 902 and 904 at the sides. While cantilever 906 actuated to vibrate at its resonance frequency and its vibrations are measured using two-layer piezoelectric transducer, electrothermal actuators 902 and 904 are used to provide z-positioning.

Illustrative embodiments may be further enhanced to provide piezoelectric microcantilevers with self-actuation and differential self-sensing. Differential sensing is a favorable method of sensing in comparison to single-ended sensing due to several advantages. First, the output voltage of the differential readout goes as high as twice the output voltage of the single ended cantilever to enhance the signal to noise ratio (SNR). Secondly, the differential measurement method can further remove the feedthrough effect and other common mode voltages appearing in single output cantilevers from each of bottom or top single electrodes. Finally, in the differential scheme, higher harmonic distortion caused by non-linearity can be reduced to enhance the dynamic range of the cantilever.

Figure 10:
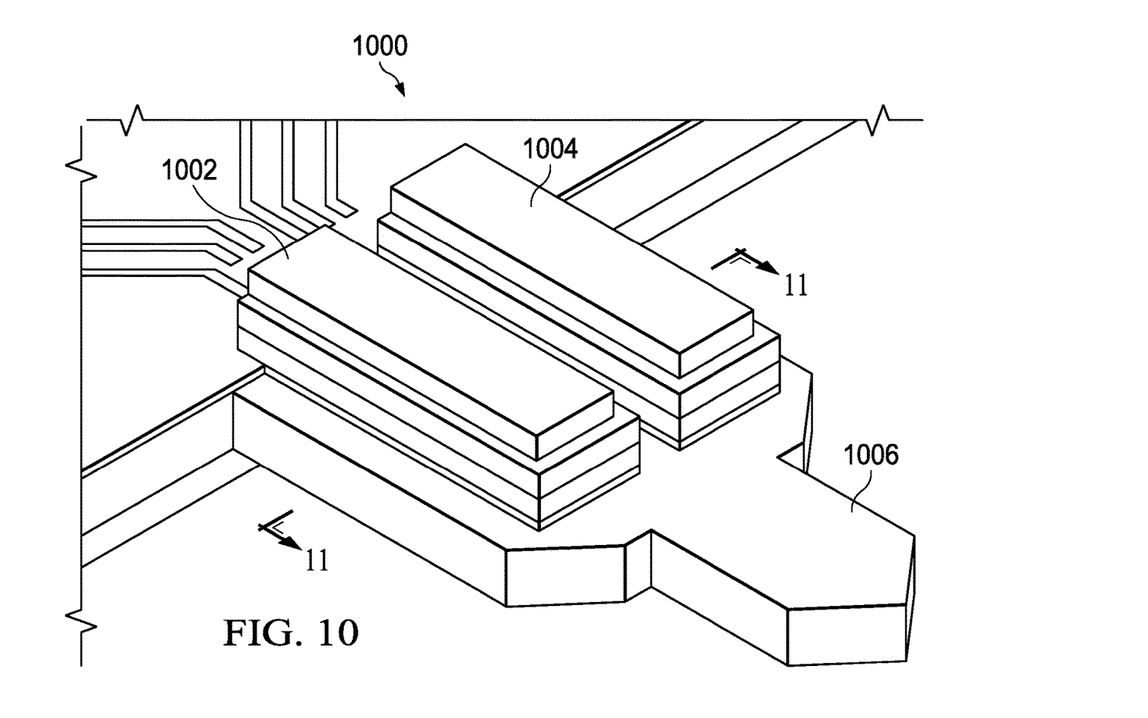
FIG. 10 is a perspective view illustration of a cantilever assembly with two stacks of two-layer piezoelectric transducers in accordance with an illustrative embodiment.

Turning to FIG. 10, a perspective view illustration of a cantilever assembly with two stacks of two-layer piezoelectric transducers is depicted in accordance with an illustrative embodiment. Cantilever assembly 1000 comprises two stacks 1002 and 1004 of two-layer piezoelectric transducers placed side by side on cantilever 1006.

Figure 11:
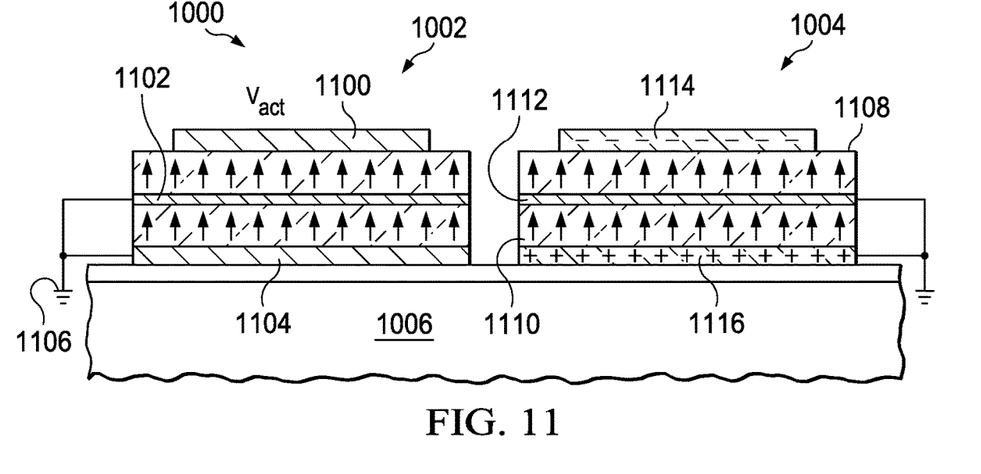
FIG. 11 is a section view illustration of a cantilever assembly with two stacks of two-layer piezoelectric transducers in accordance with an illustrative embodiment.

Turning to FIG. 11, a schematic section view illustration of a cantilever assembly with two stacks of two-layer piezoelectric transducers is depicted in accordance with an illustrative embodiment. For example, FIG. 11 may be a schematic section view illustration of two-layer piezoelectric transducer stacks 1002 and 1004 in cantilever assembly 1000 in FIG. 10. Each one of two-layer piezoelectric transducer stacks 1002 and 1004 may have a structure similar to the structure of two-layer piezoelectric transducer stack 301 in FIG. 3.

In accordance with an illustrative embodiment, one of two-layer piezoelectric transducer stacks 1002 may be used to actuate cantilever 1006 into oscillation by applying an actuation voltage $V_{Act}$ to top electrode 1100 of two-layer piezoelectric transducer stack 1002, while middle electrode 1102 and bottom electrode 1104 in the same two-layer piezoelectric transducer stack 1002 are connected to ground 1106.

When cantilever 1006 vibrates, piezoelectrically induced charges accumulate on the metal electrodes of the other two-layer piezoelectric transducer stack 1004. Both top piezoelectric transducer layer 1108 and bottom piezoelectric transducer layer 1110 of two-layer piezoelectric transducer stack 1004 have the same crystal orientation, and, therefore, the same negative transversal piezoelectric coefficient. If each of these layers 1108 and 1110 undergoes a positive transversal stress, negative and positive charges are produced respectively on top and bottom sides of the layer. Therefore, by connecting middle electrode 1112 to ground 1106, charges with different polarities appear on top electrode 1114 and bottom electrode 1116. For example, negative charges may appear on top electrode 1114 and positive charges on bottom electrode 1116.

Figure 12:
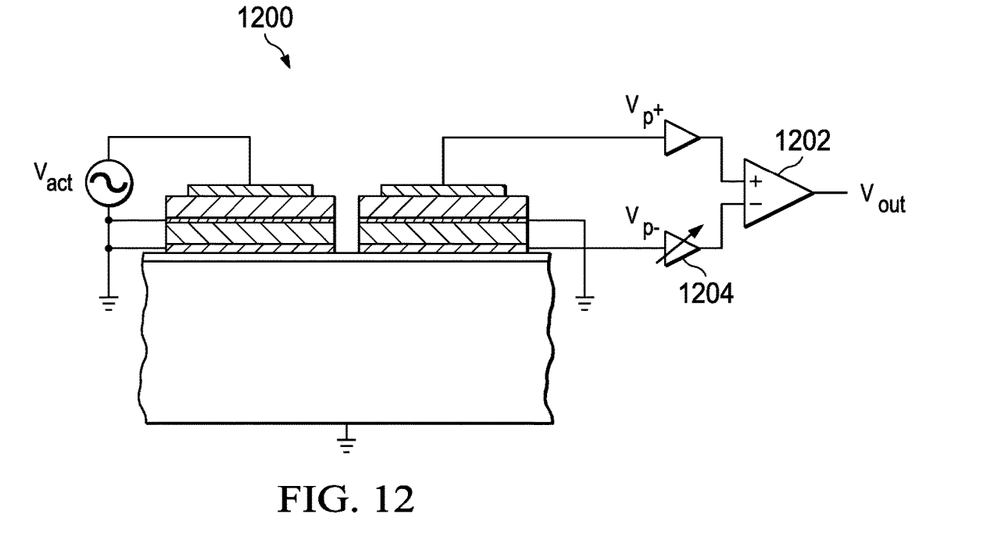
FIG. 12 is a schematic illustration of a readout circuit for differential measurement of positive and negative induced voltage in a two-layer piezoelectric transducer due to vibration of a cantilever in accordance with an illustrative embodiment.

Turning to FIG. 12, a schematic illustration of a readout circuit for differential measurement of positive and negative induced voltage in a two-layer piezoelectric transducer due to vibration of a cantilever is depicted in accordance with an illustrative embodiment. Readout circuit 1200 may be configured to measure the vibration induced voltage/charges on two-layer piezoelectric transducer stack 1004 in cantilever assembly 1000 in FIGS. 10 and 11 using differential amplifier 1202.

It should be noted that bottom piezoelectric layer 1110 is closer to the neutral axis of cantilever 1006 and therefore experiences less bending momentum. As a result, less voltage is induced on bottom electrode 1116, requiring further amplification. Buffer stage 1204 with an adjustable gain is used before differential amplifier 1202 to compensate gain mismatches between positive and negative paths.

Figure 13:
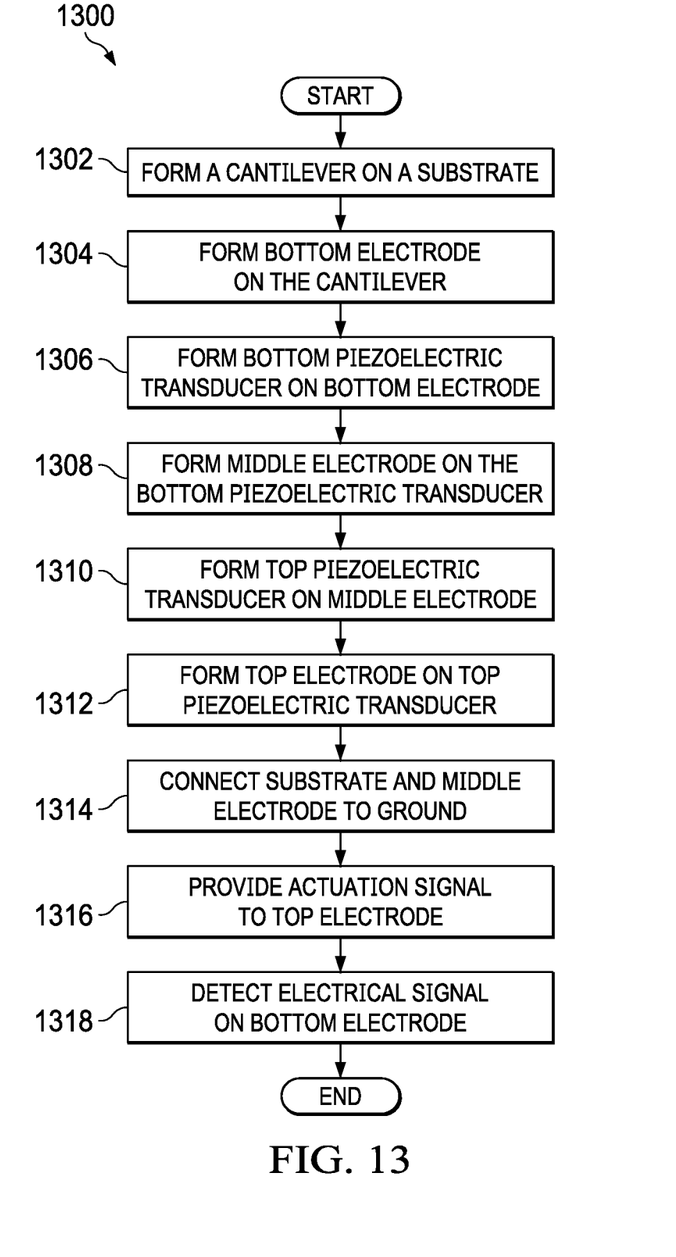
FIG. 13 is a flowchart illustrating a process of forming a cantilever assembly in accordance with an illustrative embodiment.

FIG. 13 is a flowchart illustrating a process of forming a cantilever assembly in accordance with an illustrative embodiment. Process 1300 might be implemented to make a cantilever assembly as shown in FIGS. 3-12.

Process 1300 begins by forming a cantilever on a substrate (step 1302). The substrate might be formed by growing a thermal oxide layer on a silicon-on-insulator substrate with a doped p-type device layer, wherein the thermal oxide layer isolates the substrate from the bottom electrode.

Next, a bottom electrode is formed on the cantilever (step 1304). The bottom electrode might be a 200 nm thick platinum layer on the cantilever.

Next, a bottom piezoelectric transducer is formed on the bottom electrode placed such that the bottom electrode is situated between the substrate and the bottom piezoelectric transducer (step 1306). The bottom piezoelectric transducer might be a 1 µm thick aluminum nitride layer on the bottom electrode.

Next, a middle electrode is formed on the bottom piezoelectric transducer placed such that the bottom piezoelectric transducer is situated between the bottom electrode and the middle electrode (step 1308). The middle electrode might be a 200 nm thick molybdenum layer on the bottom piezoelectric transducer.

Next, a top piezoelectric transducer is formed on the middle electrode placed such that the middle electrode is situated between the bottom piezoelectric transducer and the top piezoelectric transducer (step 1310). The top piezoelectric transducer might be a 1 µm thick aluminum nitride layer on the middle electrode.

Next, a top electrode is formed on the top piezoelectric transducer placed such that the top piezoelectric transducer is situated between the middle electrode and the top electrode (step 1312). The top electrode might be a 1 µm thick aluminum layer on the top piezoelectric transducer.

Process 1300 continues by connecting the middle electrode and the substrate to an electrical ground (step 1314). An actuation signal is then provided to the top electrode which will cause the cantilever to oscillate (step 1316). Finally, an electrical signal is detected on the bottom electrode and measured relative to a vibration amplitude of the cantilever as the cantilever moves over a surface and continuously oscillates because of the actuation signal provided to the top electrode (step 1318). Process 1300 then ends.

Figure 14:
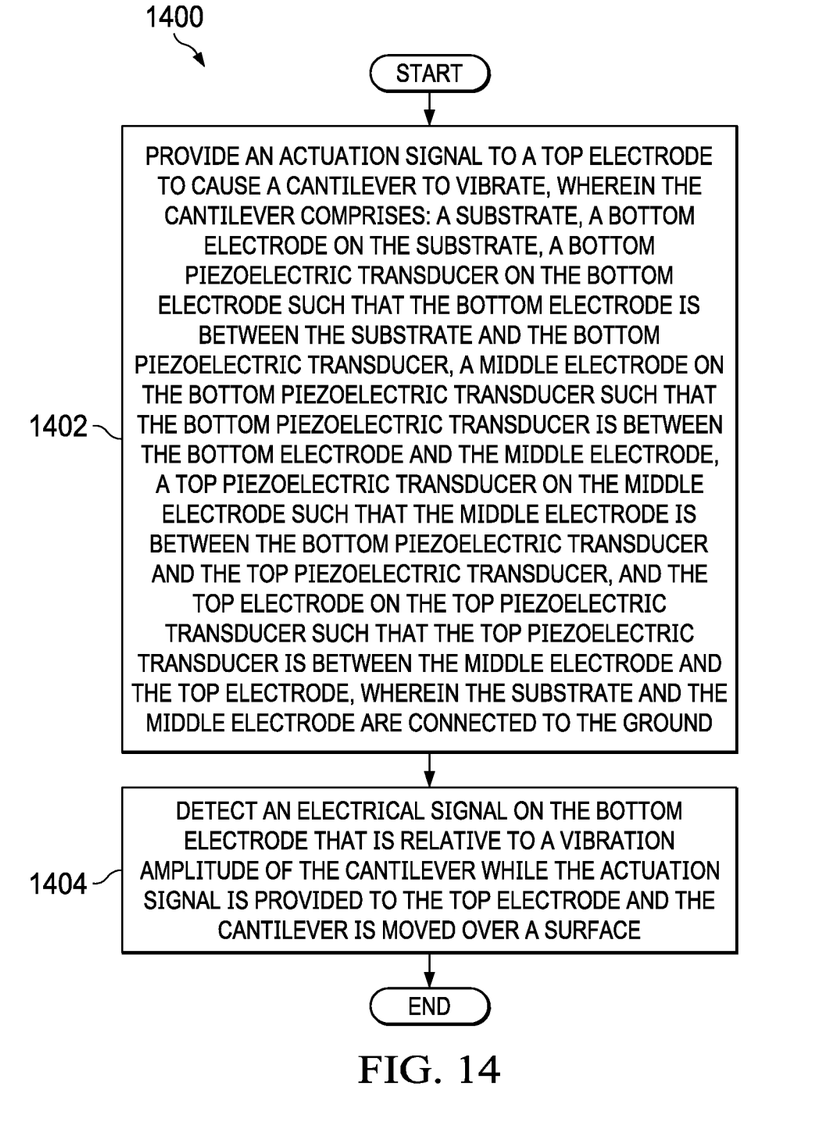
FIG. 14 is a flowchart illustrating a process of atomic force microscopy in accordance with an illustrative embodiment.

FIG. 14 is a flowchart illustrating a process of atomic force microscopy in accordance with an illustrative embodiment. Process 1400 might be implemented using a cantilever assembly as shown in FIGS. 3-12.

Process 1400 begins by providing an actuation signal on the top electrode of a cantilever assembly to cause the cantilever to vibrate where the cantilever comprises: a substrate, a bottom electrode on the substrate, a bottom piezoelectric transducer on the bottom electrode such that the bottom electrode is between the substrate and the bottom piezoelectric transducer, a middle electrode on the bottom piezoelectric transducer such that the bottom piezoelectric transducer is between the bottom electrode and the middle electrode, a top piezoelectric transducer on the middle electrode such that the middle electrode is between the bottom piezoelectric transducer and the top piezoelectric transducer, and the top electrode on the top piezoelectric transducer such that the top piezoelectric transducer is between the middle electrode and the top electrode, and wherein the substrate and the middle electrode are connected to ground (step 1402). The cantilever assembly could be formed by process 1300. The substrate might be formed as a silicon-on-insulator substrate comprised of a device layer, an $SiO_2$ buried oxide layer, and a handle layer. The cantilever could then be comprised of an $SiO_2$ isolation layer between the substrate and the bottom electrode.

As the cantilever is moved over a surface, electrical signals on the bottom electrode of the cantilever are detected and measured relative to a vibration amplitude of the cantilever while the actuation signal is provided to the top electrode of the cantilever assembly (step 1404). Process 1400 then ends.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

What is claimed is:

1. A cantilever assembly, comprising:
   a cantilever made of a silicon substrate;
   a readout circuit;
   a bottom electrode on the substrate, wherein the bottom electrode is connected to the readout circuit, and wherein the readout circuit is configured to detect an electrical signal on the bottom electrode that is relative to a vibration amplitude of the cantilever;
   a bottom piezoelectric transducer on the bottom electrode such that the bottom electrode is between the substrate and the bottom piezoelectric transducer;
   a middle electrode on the bottom piezoelectric transducer such that the bottom piezoelectric transducer is between the bottom electrode and the middle electrode, wherein the middle electrode is connected to ground;
   a top piezoelectric transducer on the middle electrode such that the middle electrode is between the bottom piezoelectric transducer and the top piezoelectric transducer;
   a top electrode on the top piezoelectric transducer, such that the top piezoelectric transducer is between the middle electrode and the top electrode, wherein the top electrode is connected to a driver configured to provide an actuation signal to the top electrode to cause the cantilever to vibrate; and
   respective wirebond pads that provide electrical connections to the electrodes.

2. The cantilever assembly of claim 1, wherein the substrate comprises a silicon-on-insulator substrate comprising:
   a doped silicon device layer;
   an $SiO_2$ buried oxide layer; and
   a handle layer.

3. The cantilever assembly of claim 1, wherein:
   the bottom electrode is approximately 200 nm thick;
   the bottom piezoelectric transducer is approximately 1 µm thick;
   the middle electrode is approximately 200 nm thick;
   the top piezoelectric transducer is approximately 1 µm thick; and
   the top electrode is approximately 1 µm thick.

4. The cantilever assembly of claim 1, wherein:
   the bottom electrode comprises platinum;
   the middle electrode comprises molybdenum; and
   the top electrode comprises aluminum.

5. The cantilever assembly of claim 1, wherein the bottom piezoelectric transducer and the top piezoelectric transducer comprise aluminum nitride.

6. The cantilever assembly of claim 1, further comprising an $SiO_2$ isolation layer between the substrate and the bottom electrode.

7. The cantilever assembly of claim 1, wherein the cantilever assembly comprises a cantilever for atomic force microscopy.

8. A method of atomic force microscopy, the method comprising:
   providing an actuation signal to a top electrode to cause a cantilever to vibrate, wherein the cantilever comprises: a doped silicon substrate, a bottom electrode on the substrate, a bottom piezoelectric transducer on the bottom electrode such that the bottom electrode is between the substrate and the bottom piezoelectric transducer, a middle electrode on the bottom piezoelectric transducer such that the bottom piezoelectric transducer is between the bottom electrode and the middle electrode, respective wirebond pads that provide electrical connections to the electrodes, a top piezoelectric transducer on the middle electrode such that the middle electrode is between the bottom piezoelectric transducer and the top piezoelectric transducer, and the top electrode on the top piezoelectric transducer such that the top piezoelectric transducer is between the middle electrode and the top electrode, wherein the substrate and the middle electrode are connected to ground; and
   detecting an electrical signal on the bottom electrode that is relative to a vibration amplitude of the cantilever while the actuation signal is provided to the top electrode and the cantilever is moved over a surface.

9. The method of claim 8, wherein the substrate comprises a silicon-on-insulator substrate comprising:
   a device layer;
   an $SiO_2$ buried oxide layer; and
   a handle layer.

10. The method of claim 8, wherein:
the bottom electrode is approximately 200 nm thick;
the bottom piezoelectric transducer is approximately 1 μm thick;
the middle electrode is approximately 200 nm thick;
the top piezoelectric transducer is approximately 1 μm thick; and
the top electrode is approximately 1 μm thick.

11. The method of claim 8, wherein:
the bottom electrode comprises platinum;
the middle electrode comprises molybdenum; and
the top electrode comprises aluminum.

12. The method of claim 8, wherein the bottom piezoelectric transducer and the top piezoelectric transducer comprise aluminum nitride.

13. The method of claim 8, wherein the cantilever further comprises an $SiO_2$ isolation layer between the substrate and the bottom electrode.

14. An apparatus, comprising:
a cantilever made from a doped silicon substrate, wherein the substrate is connected to ground;
a first two-layer piezoelectric transducer stack on the cantilever comprising:
   a first bottom electrode on the cantilever;
   a first bottom piezoelectric transducer on the first bottom electrode such that the first bottom electrode is between the cantilever and the first bottom piezoelectric transducer;
   a first middle electrode on the first bottom piezoelectric transducer such that the first bottom piezoelectric transducer is between the first bottom electrode and the first middle electrode, wherein the first middle electrode is connected to ground;
   a first top piezoelectric transducer on the first middle electrode such that the first middle electrode is between the first bottom piezoelectric transducer and the first top piezoelectric transducer; and
   a first top electrode on the first top piezoelectric transducer such that the first top piezoelectric transducer is between the first middle electrode and the first top electrode, wherein the first top electrode is connected to a driver configured to provide an actuation signal to the first two-layer piezoelectric transducer stack to cause the cantilever to vibrate;
a second two-layer piezoelectric transducer stack on the cantilever comprising:
   a second bottom electrode on the cantilever, wherein the second bottom electrode is connected to a readout circuit, and wherein the readout circuit is configured to detect an electrical signal on the second two-layer piezoelectric transducer stack that is relative to a vibration amplitude of the cantilever;
   a second bottom piezoelectric transducer on the second bottom electrode such that the second bottom electrode is between the cantilever and the second bottom piezoelectric transducer;
   a second middle electrode on the second bottom piezoelectric transducer such that the second bottom piezoelectric transducer is between the second bottom electrode and the second middle electrode, wherein the second middle electrode is connected to ground;
   a second top piezoelectric transducer on the second middle electrode such that the second middle electrode is between the second bottom piezoelectric transducer and the second top piezoelectric transducer; and
   a second top electrode on the second top piezoelectric transducer such that the second top piezoelectric transducer is between the second middle electrode and the second top electrode; and
respective wirebond pads that provide electrical connections to the electrodes.

* * * * *